United States Patent [19]

Hashimoto

[11] Patent Number: 4,887,242
[45] Date of Patent: Dec. 12, 1989

[54] NON-VOLATILE SEMICONDUCTOR MEMORY DEVICE HAVING MEANS TO LATCH THE INPUT DATA BITS FOR CONTROLLING THE DRAIN AND GATE VOLTAGES OF MEMORY CELL TRANSISTORS

[75] Inventor: Kiyokazu Hashimoto, Tokyo, Japan

[73] Assignee: NEC Corporation, Tokyo, Japan

[21] Appl. No.: 255,697

[22] Filed: Oct. 11, 1988

[30] Foreign Application Priority Data

Oct. 9, 1988 [JP] Japan ................................. 62-255828

[51] Int. Cl.$^4$ ........................... G11C 7/00; G11C 8/00
[52] U.S. Cl. ............................ 365/238.5; 365/189.11; 365/189.05; 365/230.08; 365/218
[58] Field of Search ........... 365/238.5, 189.11, 189.05, 365/230.05, 230.08, 218, 177

[56] References Cited

U.S. PATENT DOCUMENTS 4,701,884 10/1987 Aoki et al. .......................... 365/238
4,771,404 9/1988 Mano et al. .......................... 365/238

*Primary Examiner*—Stuart N. Hecker
*Assistant Examiner*—Melissa J. Koval
*Attorney, Agent, or Firm*—Sughrue, Mion, Zinn, Macpeak & Seas

[57] ABSTRACT

There is disclosed a non-volatile semiconductor memory device provided with column latching circuits each temporally memorizing plural bytes of input data bits, and gate and drain voltage levels of each of memory cell transistors are controlled on the basis of the input data bits latched into the column latching circuits for a simultaneous write-in operation, so that only column address selecting lines and row address lines are provided for specifying a plurality of memory cell groups in the simultaneous write-in operation.

11 Claims, 10 Drawing Sheets

PRIOR-ART

PRIOR-ART

PRIOR-ART

PRIOR-ART

PRIOR-ART

PRIOR-ART

PRIOR-ART

NON-VOLATILE SEMICONDUCTOR MEMORY DEVICE HAVING MEANS TO LATCH THE INPUT DATA BITS FOR CONTROLLING THE DRAIN AND GATE VOLTAGES OF MEMORY CELL TRANSISTORS

FIELD OF THE INVENTION

This invention relates to a non-volatile semiconductor memory device and, more particularly, to an electrically erasable programmable read only memory device.

BACKGROUND OF THE INVENTION

In general, when a semiconductor memory device is increased in integration density, a prolonged time period is consumed to write a data bit in one of the memory cells. Attempts had been made to lessen the time period consumed for write-in operation. One of such attempts is to concurrently write a plurality of data bytes during a single write-in operation, which is sometimes referred to as "page write-in function", and the page write-in function is widely applied to the semiconductor memory devices.

A typical example of the semiconductor memory device is illustrated in FIG. 1 of the drawings, and a data bit is electrically erasable and written into the memory cell of the semiconductor memory device. Then, the semiconductor memory device is of the EEPROM (Electrically Erasable Programmable Read Only Memory) type. The semiconductor memory device shown in FIG. 1 largely comprises 256 row address lines X1 to X256, 32 column address lines Y1 to Y32, and a memory cell array 1 the memory cells of which are grouped into 8192 bytes. However, only four memory cell groups 2, 3, 4 and 5 are illustrated in detail and the four memory cell groups 2, 3, 4 and 5 are located at four corners of the memory cell array 1, respectively. Then, address locations of first, thirty second, eight thousand one hundred and sixty first and eight thousand one hundred and ninety second bytes are respectively assigned to the four memory cell groups 2, 3, 4 and 5, respectively. Each memory cell group is provided with eight memory cells for memorizing a byte of data bits. All of the memory cell groups are identical in circuit arrangement with one another, so that description is made for the memory cell group 2 only and other memory cells are omitted from the following description as if no other memory cell is incorporated. However, transistors and signal lines of another memory cell group are hereinunder mentioned by reference names with a combination of numerals assigned to the row address line, the column address line and a bit location, if necessary. For example, transistors gated by the column address line Y32 are labeled by $Qy_{321}$ to $Qy_{328}$, because these transistors are related to the column address line Y32 and the first to eighth bit locations.

The memory cell group 2 comprises eight memory cell transistors $Mm_{111}$ to $Mm_{118}$ respectively accompanied by eight memory cell selecting transistors $Ms_{111}$ to $Ms_{118}$ and a row address selecting transistor $Mb_{11}$, and each of the memory cell transistors is of an n-channel floating gate type. The row address selecting transistors and the memory cell selecting transistors are formed by n-channel type field effect transistors. Each n-channel type field effect transistor is indicated by an arrow drawn from the source node thereof, but each p-channel type field effect transistor is indicated by an arrow toward the source node thereof. The row address line X1 is commonly coupled to not only the gate electrodes of the memory cell selecting transistors $Ms_{111}$ to $Ms_{118}$ but also the gate electrode of the row address selecting transistor $Mb_{11}$. On the other hand, the column address line Y1 is shared by column address selecting transistors $Qy_{11}$ to $Qy_{18}$ which are respectively provided in association with the memory cells, and the column address selecting transistors $Qy_{11}$ to $Qy_{18}$ are coupled at the source nodes thereof to the drain nodes of the memory cell selecting transistors $Ms_{111}$ to $Ms_{118}$, respectively. The column address selecting transistor $Qy_{11}$ is gated by the write-in controlling line $di_{11}$ and turns off to prevent a sense amplifier SA1 and non-selected memory cell groups from the write-in and erasing operations upon selection. The row address selecting transistor $Mb_{11}$ is associated with a byte column selecting transistor $Qg_1$ which has a gate electrode coupled to a byte column selecting line $Y_{1b}$. The byte column selecting transistor $Qg_1$ is then gated by the byte column selecting line $Y_{b1}$ and propagates a control signal for supplying the row address selecting transistor $Mb_{11}$ therewith. The memory cell selecting transistors $Ms_{111}$ to $Ms_{118}$ are further coupled at the drain nodes thereof to the source nodes of the write-in transistors $Qd_{11}$ to $Qd_{18}$, respectively, and the write-in transistors $Qd_{11}$ to $Qd_{18}$ have respective gate electrodes coupled to write-in controlling lines $di_{11}$ to $di_{18}$. All of the memory cell transistors $Mm_{111}$ to $Mm_{118}$ are commonly coupled to a source voltage controlling circuit 7. The byte column selecting transistor $Qg_1$ propagates the control signal Vcg or blocks it depending upon the voltage level of the byte column selecting line $Y_{1b}$, and the write-in transistors $Qd_{11}$ to $Qd_{18}$ are respectively activated by the write-in controlling lines $di_{11}$ to $di_{18}$ to supply the memory cell selecting transistors $Ms_{111}$ to $Ms_{118}$, respectively, with a write-in voltage Vwr.

Now, a write-in operation is described for the memory cell groups 2 and 3 assigned the first byte and the thirty second byte. However, the memory cells except for these forming part of the memory cell groups 2 and 3 are ignored in the following description for the sake of simplicity. Each write-in operation is divided into a loading phase followed by an automatically erasing phase and a write-in phase. In the loading phase, memory cell groups are selected from the memory cell array, and logic levels are decided on the basis of write-in data bits. The data bits stored in the memory cell groups 2 and 3 are concurrently erased in the automatically erasing phase next to the loading phase, and the write-in data bits are finally written into the selected memory cell groups in the write-in phase. The control signal Vcg has a write-in/erasing level Vpp during the automatically erasing phase and is shifted to a read-out level of about 1 volt in a read-out operation. However, the control signal Vcg is recovered to the ground level when the semiconductor memory device enters another phase. On the other hand, the write-in voltage Vwr stays in the ground level in both loading and automatically erasing phases. However, the write-in voltage Vwr is shifted to the write-in/erasing level Vpp during the write-in phase. The source voltage controlling circuit 7 is responsive to a write-in signal WR which goes up to a positive voltage level Vcc during the write-in phase only. When the write-in signal WR goes up to positive voltage level Vcc, n-channel type field effect transistors Qs2 and Qs3 turn on but a p-channel type field effect transistor Qs1 and an n-channel type field effect transistor Qs4 remain off. Then, a source voltage Vs goes up to a positive voltage level of "Vcc-Vth" where Vth is the threshold voltage of the n-channel type field effect transistor Qs3. However, the source voltage Vs remains in the ground level during the loading and automatically erasing phases due to the write-in signal of the ground level.

Turning to FIG. 2, there is shown a data input circuit 8 which produces the write-in controlling signals $di_{11}$ to $di_{328}$. The data input circuit 8 is provided with eight input blocks Di1 to Di8, and each input block produces 32 write-in controlling signals respectively corresponding to 32 columns of the memory cells each selected from each of the memory cell groups. All of the input blocks Di1 to Di8 are similar in circuit arrangement, so that description is focused upon the input block Di1 only. The input block Di1 comprises a latching circuit 9, thirty two gate transistors $Qt_1$ to $Qt_{32}$ respectively controlled by the column address lines Y1 to Y32, and thirty two high-voltage latching circuits $Lt_1$ to $Lt_{32}$. The latching circuit 9 is responsive to a latching signal DL and the inverting signal thereof to store an input data bit I1 which is transferred to one of the high-voltage latching circuits through one of the gate transistors depending upon the selected column address line. Thus, the input data bit I1 is stored by one of the high-voltage latching circuits, and the high-voltage latching circuit produces a high voltage write-in control signal supplied to the write-in controlling line.

The latching circuit 9 is illustrated in detail in FIG. 3 of the drawings. The latching circuit 9 comprises a first transfer gate 10, a series combination of inverter circuits 11 and 12 coupled to the first transfer gate 10 and a second transfer gate 13 coupled in parallel to the series combination of the inverter circuits 11 and 12. The first transfer gate 10 is provided with a p-channel enhancement type field effect transistor $Ql_1$ and an n-channel enhancement type field effect transistor $Ql_2$, and the second transfer gate 13 is also provided with a p-channel enhancement type field effect transistor $Ql_3$ and an n-channel enhancement type field effect transistor $Ql_4$. The latching signal DL and the inverting signal thereof are respectively supplied to the n-channel enhancement transistor $Ql_2$ and the p-channel enhancement transistor $Ql_1$ for the first transfer gate and to the p-channel enhancement type field effect transistor $Ql_3$ and the n-channel enhancement type field effect transistor $Ql_4$, so that the first and second transfer gates 10 and 13 are complementarily shifted between on states and off states. As a result, when the latching signal DL goes up to the high level, the input data bit I1 passes through the first transfer gate 10 and is, accordingly, latched in the series combination of the inverter circuits 11 an 12. Subsequently, the latching signal DL goes down to the low level, then the first transfer gate 10 turns off but the second transfer gate 13 turns on to retain the input data bit I1.

The circuit arrangement of the high-voltage latching circuit $Lt_1$ is illustrated in detail in FIG. 4 of the drawings. The high-voltage latching circuit $Lt_1$ comprises two high-voltage inverter circuits 14 and 15 coupled in series and a bypassing path 16 coupled in parallel to the high-voltage inverter circuits 14 and 15. Each of the high-voltage inverter circuits 14 and 15 is provided with a p-channel enhancement type field effect transistor $Qh_1$ or $Qh_3$ and an n-channel enhancement type field effect transistor $Qh_2$ or $Qh_4$. Each p-channel enhancement type field effect transistors $Qh_1$ or $Qh_3$ is formed in an n-well supplied with a biasing signal Vpp', and the biasing signal Vpp' is in the positive voltage level Vcc during the loading phase. However, the biasing signal Vpp' goes up to the write-in/erasing level Vpp when the semiconductor memory device is shifted to the automatically erasing phase or the write-in phase. Each of the component transistors $Qh_3$ and $Qh_4$ is sufficiently small in gate width/gate length ratio with respect to the corresponding component transistor of the inverter circuit 12, so that the write-in control signal on the write-in control line $di_{11}$ is varied in voltage level depending upon the voltage level of the input data bit. Namely, when the input data bit I1 of the high level is supplied to the high-voltage inverter circuit 14, the n-channel enhancement type field effect transistor $Qh_2$ turns on to cause a node 16 to have the ground level which allows the n-channel enhancement type field effect transistor $Qh_4$ to remain off. This results in the positive voltage level Vcc on the write-in/erasing line $di_{11}$ which is fed back to the high-voltage inverter circuit 14, thereby allowing the node 16 to memorize the input data bit $di_{11}$. In this situation, if the biasing signal Vpp' goes up from the positive voltage level Vcc to the write-in/erasing level Vpp, the write-in control line $di_{11}$ follows the biasing signal Vpp', thereby rising from the positive voltage level Vcc to the write-in/erasing level Vpp. On the other hand, if the input data bit of the low level is supplied to the high-voltage inverter circuit 14, the node 16 goes up to the positive voltage level Vcc by tuning the p-channel enhancement type field effect transistor $Qh_1$ on. Then, the n-channel enhancement type field effect transistor $Qh_4$ turns on to causing the write-in/erasing line $di_{11}$ to remain in the ground level. In this situation, the write-in/erasing line $di_{11}$ is kept in the ground level even if the biasing voltage goes up from the positive voltage level Vcc to the write-in/erasing level Vpp.

Turning to FIG. 5 of the drawings, there is shown a column address decoder circuit 17 which activates the column address line Y1 for gating the column address selecting transistors $Qy_{11}$ to $Qy_{18}$. The column address decoder circuit 17 is provided for the column address line Y1, but other groups of column address selecting transistors are associated with other column address decoder circuits, respectively. The column address decoder circuit 17 comprises a NAND gate 18 and a NOR gate 19 provided with two p-channel enhancement type field effect transistors 20 and 21 and two n-channel enhancement type field effect transistors 22 and 23. A set of address signal lines 24 are coupled in parallel to the input nodes of the NAND gate 18, and the NOR gate 19 are coupled at the two input nodes thereof to the output node of the NAND gate 18 and a write-in/erasing controlling signal WRITE, respectively. The column address decoder circuit 17 thus arranged is operative to drive the column address line Y1 which are shared by the column address selecting transistors $Qy_{11}$ to $Qy_{18}$ as shown in FIG. 1. Namely, the write-in/erasing controlling signal goes up to the positive voltage level Vcc during the automatically erasing phase and the write-in phase, and, for this reason, the column address line Y1 remains in the ground level due to the n-channel enhancement type field effect transistor 23 in the on-state. However, the write-in/erasing controlling signal WRITE is shifted to the ground level upon entrance into the loading phase, so that the NOR gate 19 is responsive to the level at the output node of the NAND gate 18. When the column address lines 24 specify the column address decoder circuit 17, the NAND gate 18 produces the low level which allows the p-channel enhancement type field effect transistor 21 to turn on to drive the column address line Y1 to the positive voltage level Vcc. However, the other column address decoder circuits have the respective NAND gates each having the output node in the positive voltage level Vcc, then the respective NOR gates of the decoder circuits produce the respective low voltage levels, thereby allowing the other column address lines to remain in the inactive levels, respectively.

In FIGS. 6 and 7 of the drawings, there is shown a byte column selecting circuit 25 which drives the byte column selecting line $Y_{1b}$. Though not shown in the drawings, each byte column selecting line is associated with each byte column selecting circuit. The byte column selecting circuit 25 comprises NAND gates 26 and 27, a high-voltage switching circuit 28, an inverter circuit 29 and a latching circuit 30. The NAND gate 27 is provided with two p-channel enhancement type field effect transistors 31 and 32 coupled to the NAND gate 26 and the high-voltage switching circuit 28, respectively, two n-channel enhancement type field effect transistors 33 and 34 respectively coupled to the NAND gate 26 and the high-voltage switching circuit 28 and an n-channel depletion type field effect transistor 35. The inverter circuit 29 has a series combination of a p-channel enhancement type field effect transistor 36 and an n-channel enhancement type field effect transistor 37. The latching circuit 30 comprises two series combinations of p-channel enhancement type field effect transistors 38, 39, 40 and 41, and four n-channel enhancement type field effect transistors 42, 43, 44 and 45, and the high-voltage switching circuit 28 comprises p-channel enhancement type field effect transistors 46, 47 and 48 each formed in an n-type well supplied with the biasing signal Vpp', two n-channel enhancement type field effect transistors 49 and 50, and an inverter circuit 51. The address signal lines 24 are coupled to the input nodes of the NAND gate 26, and the NAND gate 26 produces the low level at the output node thereof if the address signal lines 24 specify the leftmost byte column of the memory cell array 1. However, the high level takes place if the address signal lines 24 specify another byte column. Then, the byte column selecting circuit 25 is specified by the address signal lines 24, the low voltage level is produced at the output node thereof which is inverted by the inverter circuit 29 to allow an output node 52 to go up to the positive voltage level Vcc. This results in that a node 53 goes down to the ground level by turning the n-channel enhancement type field effect transistor 42 on. However, a complementary node 54 has the positive voltage level Vcc because a conduction path is formed through the p-channel enhancement type field effect transistors 40 and 41 under a resetting signal RESET of an inactive the ground level. The complementary node 54 causes the p-channel type enhancement type field effect transistor 38 to be turned off in so far as the resetting signal RESET remains in the inactive the ground level, so that the node 53 keeps the ground level even if the node 52 is shifted to the positive voltage level Vcc. Thus, the positive voltage level Vcc at the node 52 is memorized in the latching circuit 30 until the resetting signal RESET is shifted to the high level. With the positive voltage level Vcc at the complementary node 54, the n-channel enhancement type field effect transistor 49 turns on but the n-channel enhancement type field effect transistor 50 turns off because the inverse produced by the inverter circuit 51 is supplied thereto. Then, a node 55 and a complementary node 56 have the ground level and the positive voltage level Vcc, respectively, which are allowed to stay therein by the functions of the p-channel enhancement type field effect transistor 47 of off-state and the p-channel enhancement type field effect transistor 48 of on-state. Since the biasing signal Vpp' remains in the positive voltage level Vcc during the loading phase, the nodes 55 and 56 are unchanged in voltage level. However, the biasing signal Vpp' has the write-in/erasing level Vpp during the automatically erasing and write-in phases, so that the node 55 is boosted up to the write-in/erasing level Vpp which is causative of boosting up the byte column selecting line $Y_{1b}$ toward the write-in/erasing level Vpp. On the other hand, when the address signal lines 24 do not specify the leftmost byte column, the NAND gate 26 produces the high level at the output node thereof, then causing the node 52 to remain in the ground level. The ground level is memorized into the latching circuit 30, and the node 55 and the complementary node 56 are respectively shifted to the positive voltage level Vcc and the ground level which are kept during the loading phase. In the automatically erasing and write-in phases, the byte column selecting line $Y_{1b}$ goes down to the ground level, because a conduction path takes place from the byte column selecting line $Y_{1b}$ through the field effect transistors 35, 33 and 34 to the ground due to the high level produced by the inverter circuit 51.

An example of the page write-in function is described with reference to FIG. 8 on the assumption that two bytes of data bits (10101010) and (01010101) are supplied to the semiconductor memory device for writing them into the memory cell groups 2 and 3, respectively.

Loading phase

When the semiconductor memory device is entered into the loading phase of a write-in operation, the biasing signal Vpp' and the control signal Vcg remain in the positive voltage level Vcc and the ground level, respectively. The write-in voltage Vwr also remains in the ground level but the selected row address line X1 stays in the positive voltage level Vcc. The source voltage controlling circuit 7 allows the source voltage Vs to have the ground level. At time t1, the column address signal Y1 and the byte column selecting line $Y_{1b}$ are shifted to the positive voltage level Vcc by the functions of the column address decoder circuit 17 and the byte column selecting circuit 25, respectively. The latching circuits of the data input blocks Di1 to Di8 respond to the latching signal DL and the inverse thereof to store the input data bits I1 to I8, and each of the input data bits I1 to I8 are transferred to one of the high-voltage latching circuits of each input block through one of the gate transistors selected by the column address line Y1. The latching circuits memorize the data bits (10101010), respectively, so that the high-voltage write-in control signals $di_{11}$, $di_{13}$, $di_{15}$ and $di_{17}$ are shifted to the positive voltage level Vcc but the high-voltage write-in control signals $di_{12}$, $di_{14}$, $di_{16}$ and $di_{18}$ remain in the ground level. These high-voltage write-in control signals keep in the respective levels until time t2. The byte column selecting circuit 25 is responsive to the address signals on the address signal lines 24 and the node 55 memorizes the ground level at time t2, because the series of nodes 52, 53 and 54 alternately memorize the positive voltage level Vcc, the ground level and the positive voltage level Vcc upon selection. The node 55 continues to have the ground level, and, for this reason, the byte column selecting line $Y_{1b}$ remains in the positive voltage level Vcc until the termination of the loading phase as shown in FIG. 8.

At time t2, the column address signal Y32 goes up to the positive voltage level Vcc, and the column address line Y1 is recovered from the positive voltage level Vcc to the ground level. The byte column selecting line $Y_{32b}$ goes up to the positive voltage level Vcc, and both of the column address line Y1 and the byte column selecting line $Y_{32b}$ remain in the positive voltage level Vcc over the loading phase as shown in FIG. 8. The latching circuits of the input blocks Di1 to Di8 also store the input data bits I1 to I8 which is transferred to the high-voltage latching circuits through the gate transistors selected by the column address line 32. Then, the high-voltage write-in control signals on the lines $di_{321}$, $di_{323}$, $di_{325}$ and $di_{327}$ have the ground level but the other high-voltage write-in control signals on the lines $di_{322}$, $di_{324}$, $di_{326}$ and $di_{328}$ have the positive voltage level Vcc. Thus, the high-voltage write-in control signals are set to either positive or ground voltage level depending upon the input data bits I1 to I8, so that the write-in transistors $Qd_{11}$ related to the accessed memory cells turn on, but the other write-in transistors are turned off. As described above, the byte column selecting lines $Y_{1b}$ and $Y_{32b}$ remain in the positive voltage level Vcc during the loading phase, so that channel take place in the respective byte column selecting transistors $Qg_1$ and $Qg_{32}$. However, the control signal Vcg remains in the ground level in this stage, and the source voltage Vs remains in the ground level. Then, no write-in operation is carried out for the memory cell transistors $Mm_{111}$ to $Mm_{118}$ and $Mm_{1321}$ to $Mm_{1328}$.

Automatically erasing phase

When the loading phase is finished, the semiconductor memory device enters the automatically erasing phase at time t4. The latching signal DL has already been recovered to the ground level, so that the latching signal DL prohibits the latching circuits of the input blocks Di1 to Di8 from a new input data bits I1 to I8 in the automatically erasing phase. This results in that no new data bit is latched into the data input circuit 8. The biasing signal Vpp' goes up from the positive voltage level Vcc to the write-in/erasing level Vpp, and the control signal Vcg goes up from the ground level to the write-in/erasing level Vpp. Moreover, The selected row address line X1 rises to the write-in/erasing level Vpp, but the write-in voltage Vwr and the source voltage Vs remain in the ground level at time t4. Since the row address line X1 rises to the write-in/erasing level Vpp, the row address selecting transistors $Mb_{11}$ and $Mb_{132}$ turn on to supply the gate electrodes of the memory cell transistors with the voltage level of "Vpp-Vth" where Vth is the threshold value of the row address selecting transistors. When the biasing signal Vpp' goes up to the write-in/erasing level Vpp, the write-in control lines are boosted up from the positive voltage level Vcc to the write-in/erasing level Vpp, because the high-voltage latching circuits coupled thereto have the respective p-channel enhancement type transistors Qh3 each formed in the n-well coupled to the biasing signal Vpp' as described with reference to FIG. 4. However, the other write-in control lines remain in the ground level even if the biasing signal rises. This results in that the write-in control lines $di_{11}$, $di_{13}$, $di_{15}$ and $di_{17}$ have the write-in/erasing level for the memory cell group 2, but the other write-in control lines for the memory cell group 2 continue to be in the ground level. Similarly, the write-in control lines $di_{322}$, $di_{324}$, $di_{326}$ and $di_{328}$ have the write-in/erasing level for the memory cell group 3, but the other write-in control lines for the memory cell group 3 continue to be in the ground level. The biasing signal Vpp' also allows the byte column selecting lines $Y_{1b}$ and $Y_{32b}$ to go up to the write-in/erasing level Vpp at time t4. As the row address line X1 is in the write-in/erasing level Vpp, all of the memory cell selecting transistors $Ms_{111}$ to $Ms_{1328}$ turn on to supply the memory cell transistors $Mm_{111}$ to $Mm_{1328}$ with the ground level. Thus, each of the memory cell transistors is supplied at the gate electrode, the drain node and the source node with the voltage level of "Vpp-Vth", the ground level and ground level, respectively. Then, electrons are injected from the drain node to the floating gate of each memory cell transistors $Mm_{111}$ to $Mm_{1328}$, thereby shifting the threshold value thereof to a voltage level higher than that of the control signal Vcg in the read-out operation which is referred to as the read-out voltage level. This means that the data bits stored therein are erased.

Write-in phase

When the automatically erasing phase is finished, the write-in signal WR goes up from the ground level to the positive voltage level Vcc at time t5. The write-in voltage Vwr is shifted from the ground level to the write-in/erasing level Vpp, but the control signal Vcg is shifted in the opposite direction. The source voltage Vs goes up from the ground level to the voltage level of "Vcc-Vth", but the selected row address line X1 and the biasing signal Vpp' remain in the write-in/erasing level Vpp. This results in that byte column selecting lines $Y_{1b}$ and $Y_{32b}$ continue to remain in the write-in/erasing level Vpp because no alternation takes place in the byte column selecting circuit 25. The write-in voltage Vwr and the source voltage Vs are changed to the write-in/erasing level Vpp and the voltage level of "Vcc-Vth", respectively, and all of the write-in controlling lines $di_{11}$ to $di_{328}$ remain in the same level as the automatically erasing phase. As a result, the write-in transistors associated with the memory cells for writing the data bits of "1" level are turned on to provide the conduction paths to the memory cell transistors. This results in that the memory cell transistors respectively accompanied by the write-in transistors in on-state are supplied with the voltage level of "Vpp-Vth", but the other memory cell transistors have the respective drain nodes in the floating state. Since, the control signal Vcg remains in the ground level, the selected memory cell transistors are supplied at the gate electrodes thereof with the ground level. This results in that the voltage level of "Vpp-Vth", the ground level and the voltage level of "Vcc-Vth" are supplied to the drain node, the gate electrode and the source node of each memory cell transistor which is accessed to write the data bit of "1" level. In this situation, the electrons are evacuated from the floating gate of each memory cell transistor, and the threshold value thereof is shifted to a voltage level lower than the read-out voltage level, thereby memorizing the data bit of "1" level. On the other hand, each of the memory cell transistor has the drain node in the floating state, and the gate electrode and the source node thereof are supplied with the ground level and voltage level of "Vcc-Vth", so that each memory cell continue to stay the erasing state. Thus, the input data bits are written into the memory cell transistors depending upon the logic level thereof. In the write-in phase, the column address lines Y1 to Y32 need to have been recovered to the ground level, because a memory cell group simultaneously activated should be prevented from an undesirable write-in operation carried out for another memory cell group. In the above described example, if the column address lines Y1 and Y32 remain in the positive voltage level Vcc, the column address selecting transistors $Qy_{11}$ and $Qy_{321}$ are turned on in the write-in phase. The input data bits of "1" level and "0" level are provided for the memory cell transistors $Mm_{111}$ and $Mm_{1321}$, respectively, so that the voltage level of "Vpp-Vth" should be supplied to the drain node of the memory cell transistor $Mm_{111}$, but the drain node of the memory cell transistor $Mm_{1321}$ should remain in the floating level. However, if the column address selecting transistors $Qy_{11}$ and $Qy_{321}$ remain in the on-states, the voltage level of "Vpp-Vth" is transferred from the drain node of the memory cell transistor $Mm_{111}$ through the column address selecting transistor $Qy_{11}$, the node SC1 and the column address selecting transistor $Qy_{1321}$ to the drain node of the memory cell transistor $Mm_{1321}$. This results in that the input data bit of "1" level is memorized in the memory cell transistor $Mm_{1321}$ instead of the right input data bit of "0" level. If the column address lines Y1 to Y32 have the positive voltage level Vcc similar to the byte column selecting lines $Y_{1b}$ to $Y_{32b}$, the voltage level of "Vcc-Vth" is applied to the drain node of the memory cell transistor $Mm_{1321}$, so that the memory cell transistor $Mm_{1321}$ is subjected to an undesirable stress. On the other hand, the byte column selecting lines are shifted to the write-in/erasing level vpp for propagation of the control signal Vcg.

However, a problem is encountered in the prior-art semiconductor memory device in large occupation area. This is because of the fact that the byte column selecting lines $Y_{1b}$ to $Y_{32b}$ or the column address lines Y1 to Y32 can not be shared by the byte column selecting transistors and the column address selecting transistors due to difference in voltage level during the write-in operation. Moreover, the two sets of lines $Y_{1b}$ to $Y_{32b}$ and Y1 to Y32 result in complex circuit arrangement.

SUMMARY OF THE INVENTION

It is therefore an important object of the present invention to provide a non-volatile semiconductor memory device which occupies a relatively small area.

It is also an important object of the present invention to provide a non-volatile semiconductor memory device which has a simple circuit arrangement.

To accomplish these objects, the present invention proposes to latch the input data bits for controlling the drain and gate voltages of each memory cell transistor.

In accordance with one aspect of the present invention, there is provided a non-volatile semiconductor memory device fabricated on a semiconductor substrate, the non-volatile semiconductor memory device being capable of performing a write-in operation having a loading phase, an automatically erasing phase and a write-in phase, comprising: (a) a plurality of memory cell groups arranged in rows and columns, each memory cell group being provided with a plurality of memory cell transistors assigned respective bit locations and having respective gate electrodes; (b) a plurality of memory cell selecting transistors each coupled in series to each of the memory cell transistors and having a gate electrode; (c) a plurality of row address selecting transistors each coupled to the gate electrodes of the memory cell transistors in each memory cell group and having a gate electrode; (d) a plurality of byte column selecting transistors each provided in association with the memory cell groups in each column and capable of providing a conduction path between a source of control signal and the row address selecting transistors respectively provided in association with the memory cell groups in each column, each of the byte column selecting transistor having a gate electrode, the control signal being shifted to a third level in the automatically erasing phase but remaining in a second level in the loading phase and the write-in phase; (e) a plurality of column address selecting transistor groups each provided in association with the memory cell groups in each column and having a plurality of column address selecting transistors respectively coupled to the memory cell selecting transistors having the respective bit locations identical with one another; (f) a plurality of column latching circuit group each provided in association with the memory cell groups in each column and having a plurality of latching circuits coupled to the memory cell selecting transistors having the respective bit locations identical with one another, the column latching circuits being coupled to a source of write-in voltage signal; (g) a plurality of byte latching circuits each provided in association with each of the byte column selecting transistors and coupled between the row address selecting transistors respectively provided in association with the memory cell groups in each column and a source of erasing voltage signal; (h) a source voltage controlling circuit responsive to a write-in signal and producing a source voltage supplied to source nodes of the memory cell transistors, the source voltage being shifted to a level near the second level in the write-in phase but remaining in a first level in the loading phase and the automatically erasing phase; (i) a data input circuit operative to latch a plurality of input data bits each having the first or second level and producing a plurality of write-in controlling signals each having the first or second level on the basis of the input data bits; (j) a plurality of data input transistors each coupled to the column address selecting transistors provided in association with memory cell selecting transistors respectively having the bit locations identical withone another, each of the data input transistors being responsive to a loading signal shifted to an active level in the loading phase to transfer each of write-in controlling signal to the column address selecting transistors, the loading signal being shifted to an inactive level in the automatically erasing phase and the write-in phase; (k) a plurality of row address lines each coupled to the gate electrodes of the memory cell selecting transistos and the row address selecting transistors which are respectively provided in association with the memory cell groups in each row, the row address lines propagating row address signals one of which is shifted to an active level in the automatically erasing phase and the write-in phase to allow the memory cell selecting transistors and the row address selecting transistors to turn on, the row address signals being shifted to an inactive level in the loading phase; and (l) a plurality of column address lines each coupled to the gate electrodes of the byte column selecting transistor and the column address selecting transistors provided in association with the memory cell groups in each column, the column address lines propagating column address signals, two or more that two of the column address signals being shifted in succession to the second level in the loading phase for allowing the control signal to be latched into the byte latching circuits and for allowing the column latching circuits to latch the write-in controlling signals, respectively, the column address signals remaining in the first level in the automatically erasing phase and the write-in phase, in which the write-in voltage signal and the erasing voltage signal are respectively shifted to the first level and third level in the automatically erasing phase and to the third level and the first level in the write-in phase, the control signal of the second level in each byte latching circuit of the second level being shifted to the third level in the presence of the erasing voltage signal of third level for automatically erasing functions, each write-in controlling signal of the second level being shifted to the third level in the presence of the write-in voltage signal of the third level for write-in function.

In accordance another aspect of the present invention there is provided a non-volatile semiconductor memory device fabricated on a semiconductor substrate, the non-volatile semiconductor memory device being capable of performing a write-in operation having a loading phase and a write-in phase, comprising: (a) a plurality of memory cell groups arranged in rows and columns, each memory cell group being provided with a plurality of memory cell transistors assigned respective bit locations and having respective gate electrodes, the memory cell transistors having source nodes coupled to a source of first level; (b) a plurality of column address selecting transistors each provided in association with the memory cell groups in each column and respectively coupled to the memory cell transistors having the respective bit locations identical with one another; (c) a plurality of column latching circuit group each provided in association with the memory cell groups in each column and having a plurality of latching circuits coupled to the memory cell transistors having the respective bit locations identical with one another, the column latching circuits being coupled to a source of write-in voltage signal; (d) a data input circuit operative to latch a plurality of input data bits each having the first level or a second level and producing a plurality of write-in controlling signals each having the first or second level on the basis of the input data bits; (e) a plurality of data input transistors each coupled to the column address selecting transistors provided in association with memory cell transistors respectively having the bit locations identical with one another, each of the data input transistors being responsive to a loading signal shifted to an active level in the loading phase to transfer each of write-in controlling signal to the column address selecting transistors, the loading signal being shifted to an inactive level in the write-in phase; (f) a plurality of row address lines each coupled to the gate electrodes of the memory cell transistors which are respectively provided in association with the memory cell groups in each row, the row address lines propagating row address signals one of which is shifted to a third level, the row address signals being shifted to the second level in the loading phase; and (g) a plurality of column address lines each coupled to the gate electrodes of the column address selecting transistors provided in association with each memory cell group for gating the column address selecting transistors, the column address lines propagating column address signals, two or more that two of the column address signals being shifted in succession to the second level in the loading phase for allowing the column latching circuits to latch the write-in controlling signals, respectively, the column address signals remaining in the first level in the write-in phase, in which the write-in voltage signal are shifted from the first level to the third level in the write-in phase, each write-in controlling signal of the second level being shifted to the third level in the presence of the write-in voltage signal of the third level for write-in function.

BRIEF DESCRIPTION OF THE DRAWINGS

The features and advantages of a non-volatile semiconductor memory device according to the present invention will be more clearly understood from the following description taken in conjunction with the accompanying drawings in which.

DESCRIPTION OF THE PREFERRED EMBODIMENTS

First embodiment

Figure 1:
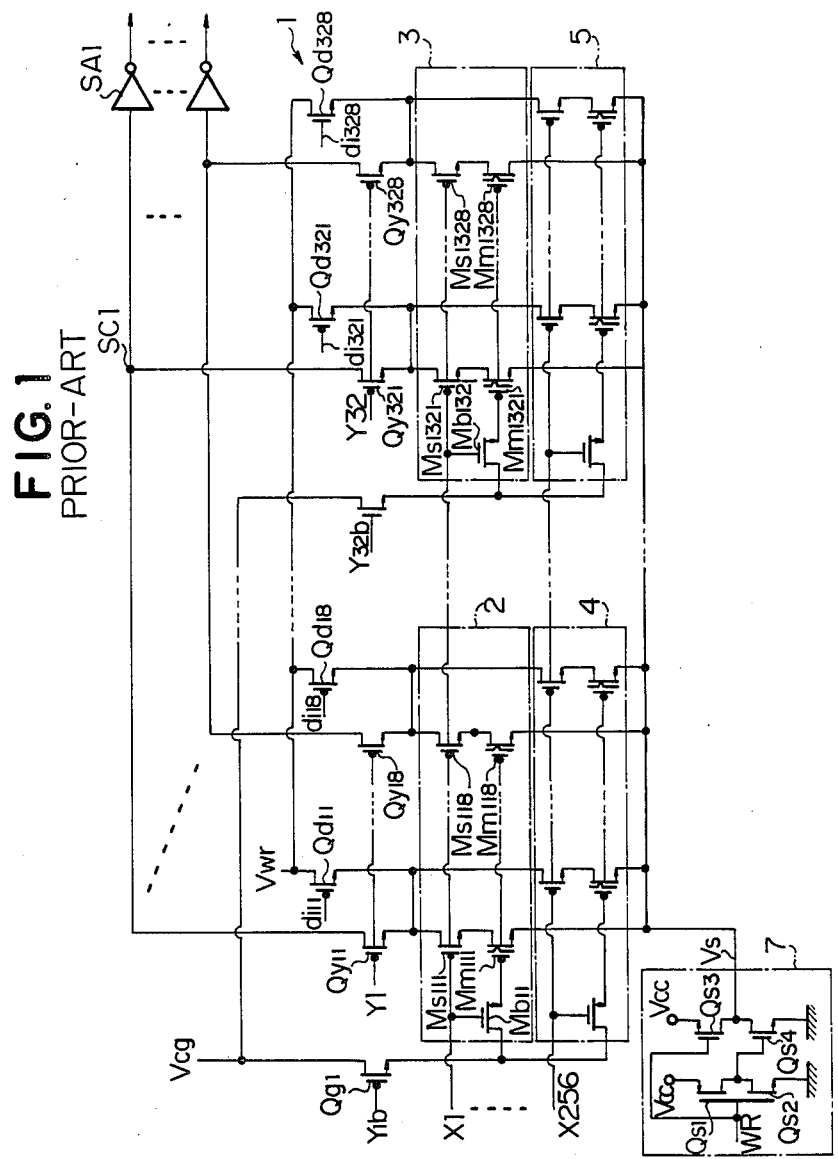
FIG. 1 is a diagram showing the circuit arrangement of a prior-art non-volatile semiconductor memory device.
Figure 2:
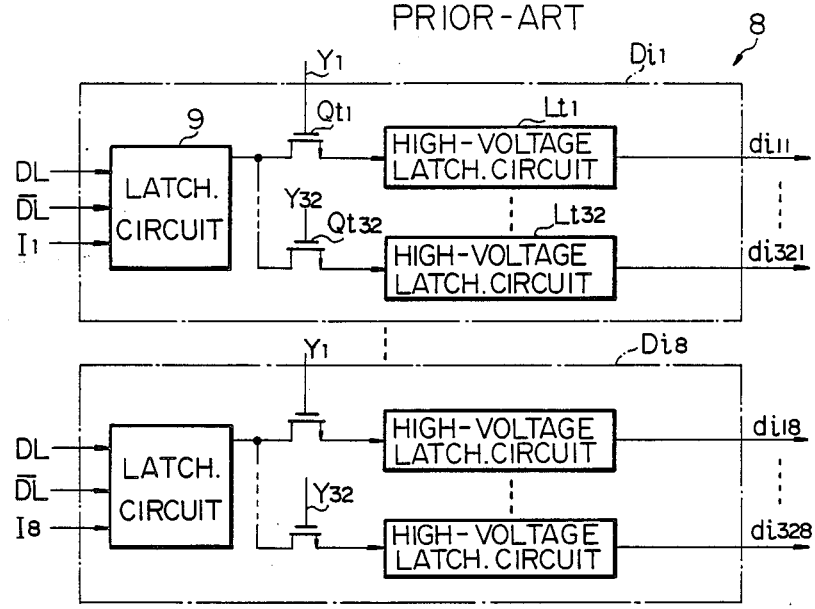
FIG. 2 is a diagram showing the circuit arrangement of a data input circuit incorporated in the prior-art non-volatile semiconductor memory device.
Figure 3:
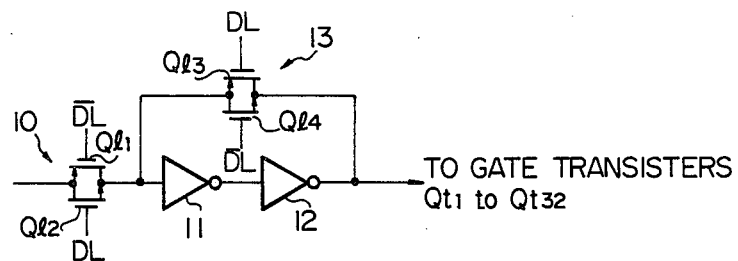
FIG. 3 is a diagram showing the circuit arrangement of a latching circuit incorporated in the data input circuit illustrated in FIG. 2.
Figure 4:
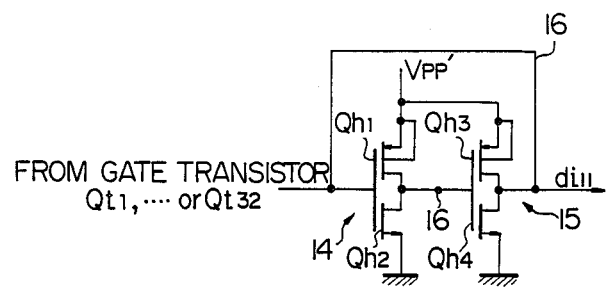
FIG. 4 is a diagram showing the circuit arrangement of a high-voltage latching circuit incorporated in the data input circuit illustraed in FIG. 2.
Figure 5:
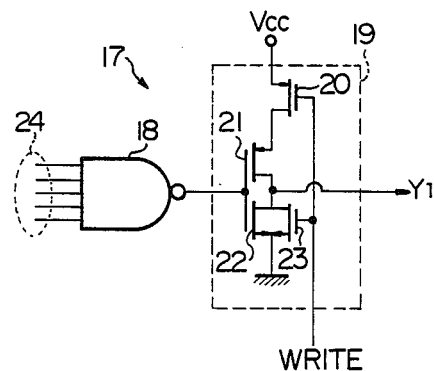
FIG. 5 is a diagram showing the circuit arrangement of a column address decoder circuit incorporated in the prior-art nonvolatile semiconductor memory device.
Figure 6:
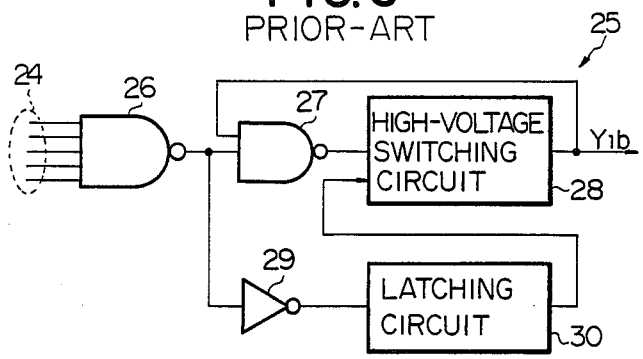
FIG. 6 is a diagram showing the circuit arrangement of a byte column selecting circuit incorporated in the prior-art nonvolatile semiconductor memory device.
Figure 7:
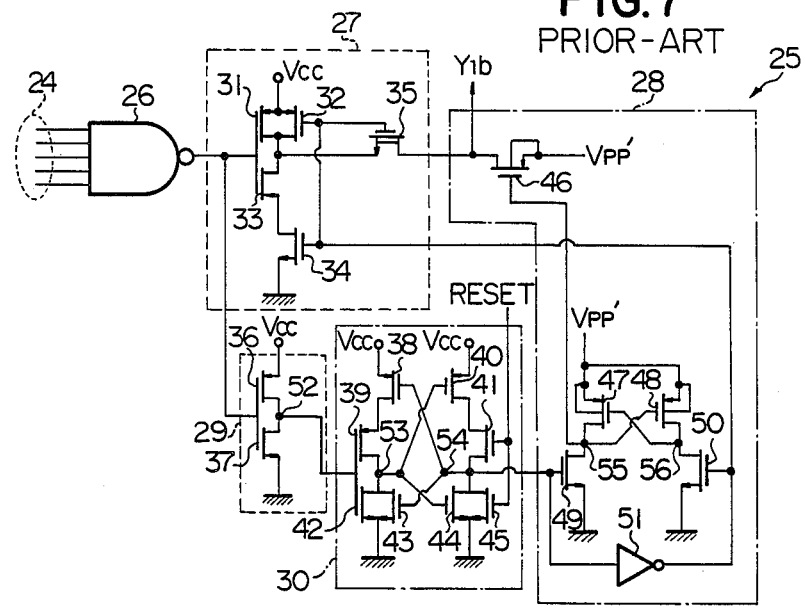
FIG. 7 is a diagram showing, in detail, the circuit arrangement of the byte column selecting circuit illustrated in FIG. 6.
Figure 8:
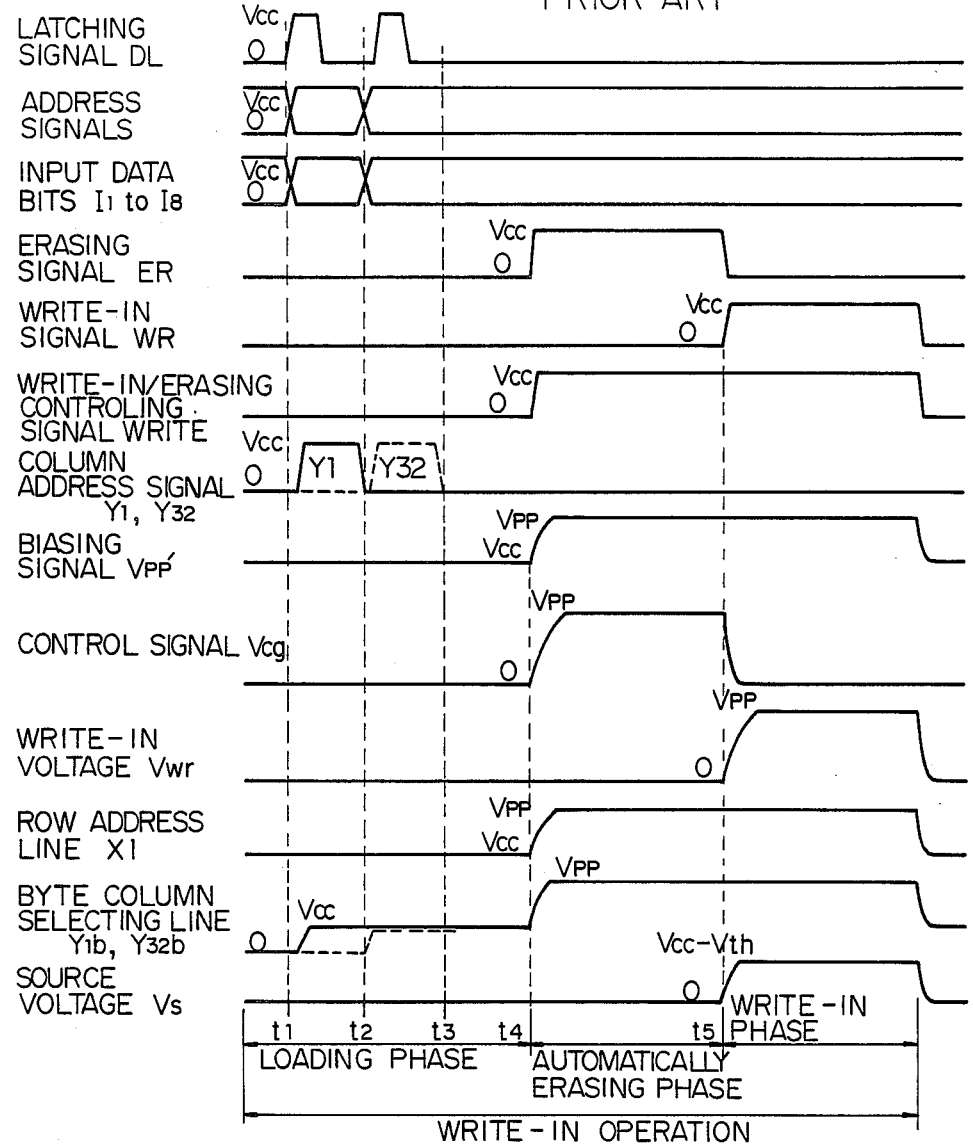
FIG. 8 is a diagram showing the waveforms of essential signals appearing in the prior-art non-volatile semiconductor memory device.
Figure 9:
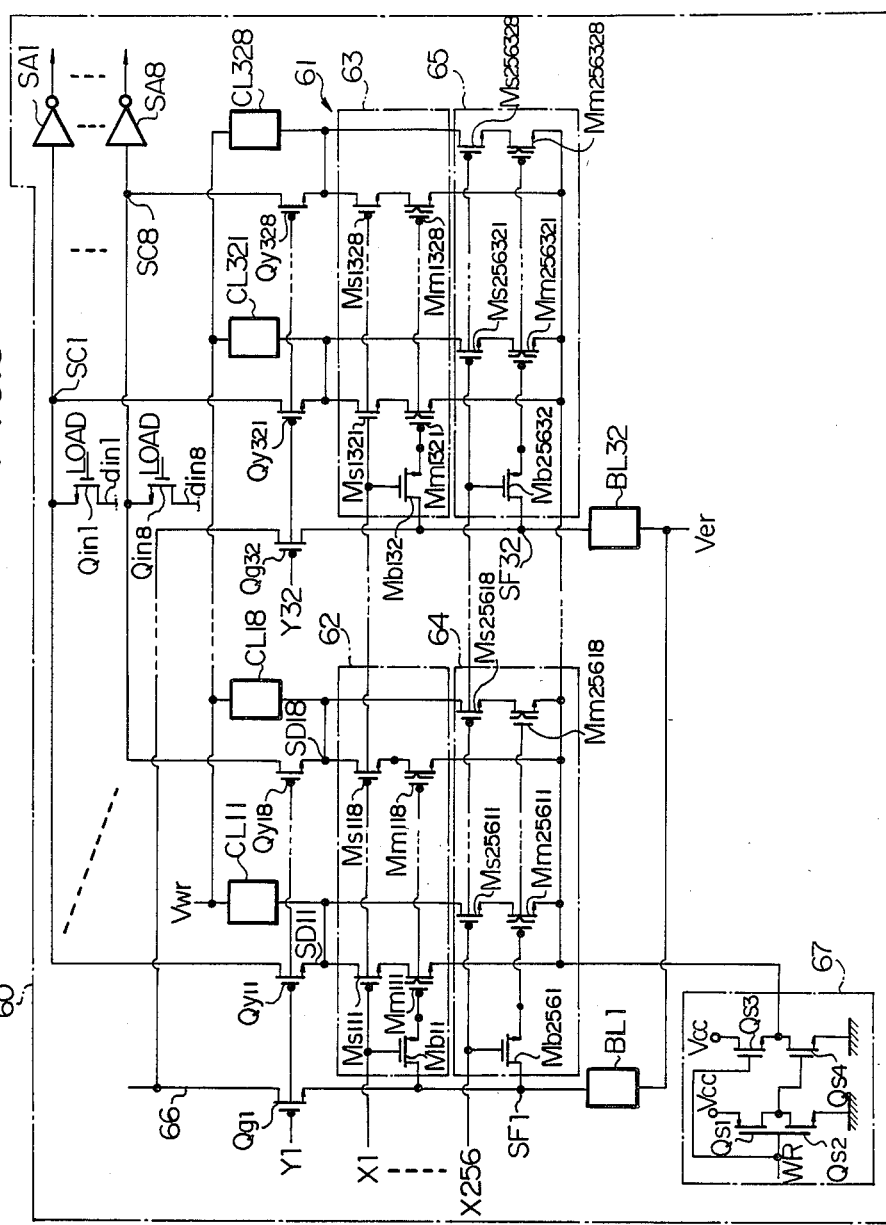
FIG. 9 is a diagram showing the circuit arrangement of a non-volatile semiconductor memory device embodying the present invention.

Referring first to FIG. 9 of the drawings, there is shown the circuit arrangement of a non-volatile semiconductor memory device of the electrically erasable programmable read only memory embodying the present invention. The non-volatile semiconductor memory device is fabricated on a semiconductor substrate of, for example, single crystalline silicon 60 and capable of executing a write-in operation divided into a loading phase, an automatically erasing phase and a write-in phase as similar to the prior-art semiconductor memory device. The non-volatile semiconductor memory device largely comprises 256 row address lines X1 to X256, 32 column address lines Y1 to Y32, and a memory cell array 61 the memory cells of which are grouped into 8192 bytes. However, only four memory cell groups 62, 63, 64 and 65 are illustrated in detail and the four memory cell groups 62, 63, 64 and 65 are located at four corners of the memory cell array 61, respectively. Then, address locations of first, thirty second, eight thousand one hundred and sixty first and eight thousand one hundred and ninety second bytes are respectively assigned to the four memory cell groups 62, 63, 64 and 65, respectively. Each memory cell group is provided with eight memory cells for memorizing a byte of data bits. All of the memory cell groups are identical in circuit arrangement with one another, so that description is made for the memory cell group 62 only, but transistors and signal lines provided in association with another memory cell group are hereinunder designated and mentioned by reference names with a combination of numerals assigned to the row address line, column address line and a bit location. For example, transistors gated by the column address line Y32 are labeled by $Qy_{321}$ to $Qy_{328}$, because these transistors are related to the column address line Y32 and the first to eighth bit locations. However, if a transistor or a line is related to the row address line X1, the column address line Y32 and the eight bit location, the transistor or the line is labeled with the numeral 1328.

The memory cell group 62 comprises eight memory cell transistors $Mm_{111}$ to $Mm_{118}$ respectively accompanied by eight memory cell selecting transistors $Ms_{111}$ to $Ms_{118}$ and a row address selecting transistor $Mb_{11}$, and each of the memory cell transistors is of an n-channel floating gate type field effect transistor. The row address selecting transistor and the memory cell selecting transistors are formed by n-channel insulating gate type field effect transistors. Each n-channel type field effect transistor and each p-channel type field effect transistor are respectively indicated by an arrow drawn from the source node thereof and an arrow toward the source node thereof as similar to those of the prior-art semiconductor memory device. The row address line X1 is commonly coupled to not only the gate electrodes of the memory cell selecting transistors $Ms_{111}$ to $Ms_{118}$ but also the gate electrode of the row address selecting transistor $Mb_{11}$. On the other hand, the column address line Y1 is shared by not only a byte column selecting transistor $Qg_1$ but also column address selecting transistors $Qy_{11}$ to $Qy_{18}$ which are respectively provided in association with the first to eighth bit locations. Source nodes of the column address selecting transistors $Qy_{11}$ to $Qy_{18}$ are denoted by SD11 to SD18, respectively. The column address selecting transistors $Qy_{11}$ to $Qy_{18}$ are capable of providing conduction paths between nodes SC1 to SC8 and the memory cell selecting transistors $Ms_{111}$ to $Ms_{118}$, respectively, and the nodes SC1 to SC8 are respectively coupled to sense amplifier circuits SA1 to SA8. The node SC1 to SC8 is further coupled to data input transistors Qin1 to Qin8 which are respectively gated by loading signal lines for a loading signal LOAD, and the loading signal LOAD goes up to the positive voltage level Vcc in the loading phase only for providing respective conduction paths between the nodes SC1 to SC8 and a data input circuit 68 illustrated in FIG. 10. The byte column selecting transistor $Qg_1$ is capable of providing a conduction path between the row address selecting transistors $Mb_{11}$ to $Mb_{2561}$ and a control line 66 where a control signal Vcg is applied. A column latching circuit CL11 is coupled in parallel between the memory cell selecting transistor $Ms_{111}$ and a source of write-in voltage signal Vwr, and all of the memory cell transistors are coupled to a source voltage controlling circuit 67 which is responsive to a write-in signal WR for shifting a source voltage Vs between the ground level and a voltage level of "Vcc-Vth". Namely, the source voltage controlling circuit 67 comprises a series combination of a p-channel enhancement type field effect transistor Qs1 and an n-channel enhancement type field effect transistor Qs2 coupled between a source of positive voltage level Vcc and a ground terminal, and a series combination of two n-channel enhancement type field effect transistors Qs3 and Qs4. The write-in signal WR is supplied to respective gate electrodes of the field effect transistors Qs1, Qs2 and Qs3, and the common drain node of the two field effect transistors Qs1 and Qs2 is coupled to gate electrode of the field effect transistor Qs4. The source voltage controlling circuit 67 thus arranged shifts the source voltage Vs to the voltage level of "Vcc-Vth" by turning the transistors Qs2 and Qs3 on but the transistors Qs1 and Qs4 off in the presence of the write-in signal WR of the positive voltage level Vcc. However, when the write-in signal WR is recovered from the positive voltage level Vcc to the ground level, the source voltage Vs goes down to the ground level due to the transistors Qs1 and Qs4 in the on-states and to the transistors Qs2 and Qs4 in the off-states. The byte column selecting transistors $Qg_1$ is further coupled through a node SF1 to a byte latching circuit BL1 which in turn is coupled to a source of erasing voltage signal Ver.

Figure 10:
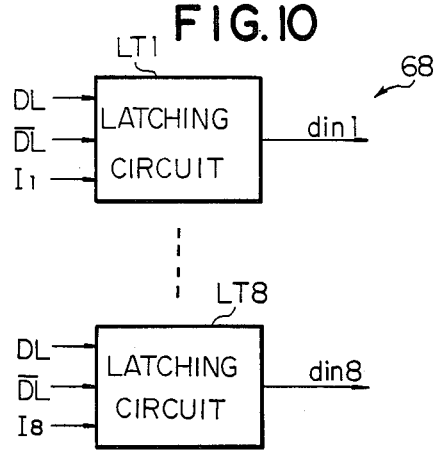
FIG. 10 is a block diagram showing a data input circuit incorporated in the non-volatile semiconductor memory device illustrated in FIG. 9.

Turning to FIG. 10 of the drawings, the data input circuit 68 is illustrated and comprises eight latching circuits LT1 to LT8 each of which is similar in circuit arrangement to the latching circuit 9 forming part of the data input circuit 8. The latching circuits LT1 to LT8 are responsive to a latching signal DL and operative to temporally memorize input data bits I1 to I8, respectively, to produce the write-in controlling signal di1 to di8. However, the data input circuit 68 is simpler in circuit arrangement than the data input circuit 8, because the high-voltage latching circuits Lt1 to Lt32 and the gate transistors Qt1 to Qt32 are not incorporated in the data input circuit 68.

Figure 11:
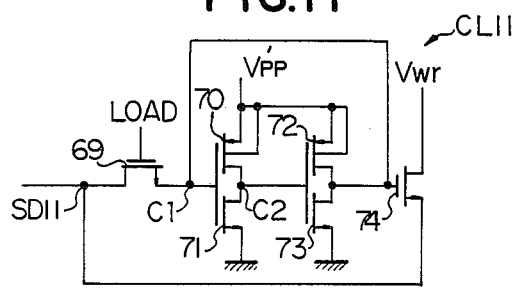
FIG. 11 is a diagram showing the circuit arrangement of a column latching circuit incorporated in the non-volatile semiconductor memory device shown in FIG. 9.

The circuit arrangement of the column latching circuit CL11 is illustrated in detail in FIG. 11 of the drawings. The column latching circuit CL11 comprises a gate transistor 69 gated by the loading signal line, a series combination of a p-channel enhancement type field effect transistor 70 and an n-channel enhancement type field effect transistor 71, a series combination of a p-channel enhancement type field effect transistor 72 and an n-channel enhancement type field effect transistor 73 and a gate transistor 74. Each of the p-channel enhancement type field effect transistors 70 and 72 are formed in respective n-wells supplied with a biasing signal Vpp', and the p-channel enhancement type field effect transistor 72 and the n-channel enhancement type field effect transistor 73 are smaller in gate width/gate length ratio than the data input transistors Qin1 to Qin8. Moreover, the p-channel enhancement type field effect transistor 72 and the n-channel type field effect transistor 73 are smaller in gate width/gate length ratio than the column address selecting transistors $Qy_{11}$ to $Qy_{18}$ and the gate transistor 69. The column latching circuit thus arranged is operative to temporally memorize the data bit on the source node SD1. Namely, when the loading signal LOAD is shifted to the positive voltage level Vcc and the source node SD11 is supplied with the voltage level of "Vcc-Vth", the gate transistor 69 turns on to transfer the voltage level to a node C1 which in turn allows the n-channel enhancement type field effect transistor 71 to turn on. The p-channel enhancement type field effect transistor 70 remains in the off-state, so that the ground level appears on a node C2. The node C2 of the ground level causes the p-channel enhancement type field effect transistor 72 to turn on but the n-channel enhancement type field effect transistor 73 to remain off. Then, the voltage level of "Vcc-Vth" is fed back to the node C1, thereby memorizing the data bit. In this situation, when the biasing signal Vpp' goes up from the positive voltage level Vcc to a write-in/erasing level Vpp, the voltage level at the nodes C1 is boosted up to the write-in/erasing level for propagation of the write-in voltage signal Vwr of the write-in/erasing level Vpp. On the other hand, when the source node SD11 is supplied with the data bit of the ground level, the ground level is also memorized in the node C1. However, no boost-up function takes place because the n-channel enhancement type field effect transistor 73 provides a conduction path between the node C1 and the ground terminal.

Figure 12:
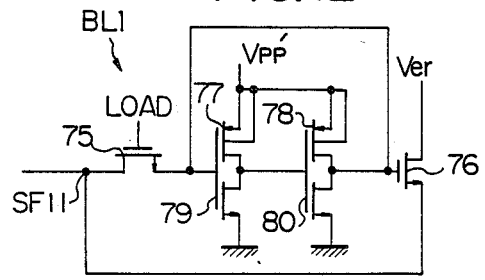
FIG. 12 is a diagram showing the circuit arrangement of a byte latching circuit incorporated in the non-volatile semiconductor memory device shown in FIG. 9.

Turning to FIG. 12, the byte latching circuit BL1 is illustrated in detail and comprises two n-channel enhancement type field effect transistors 75 and 76 and two series combinations each having a p-channel enhancement type field effect transistor 77 or 78 and an n-channel enhancement type field effect transistor 79 or 80. The field effect transistors 78 and 80 are smaller in gate width/gate length ratio than the byte column selecting transistor $Qg_1$ and the n-channel enhancement type field effect transistor 75. The byte latching circuit BL1 is similar in circuit arrangement and, accordingly, function to the column latching circuit CL1, so that no description is made for the byte latching circuit BL1.

Description is hereinunder made for a write-in operation on the assumption that two bytes of input data bits (10101010) and (01010101) are supplied to the non-volatile semiconductor memory device for memorizing them in the memory cell groups 62 and 63, respectively.

Loading phase

Figure 13:
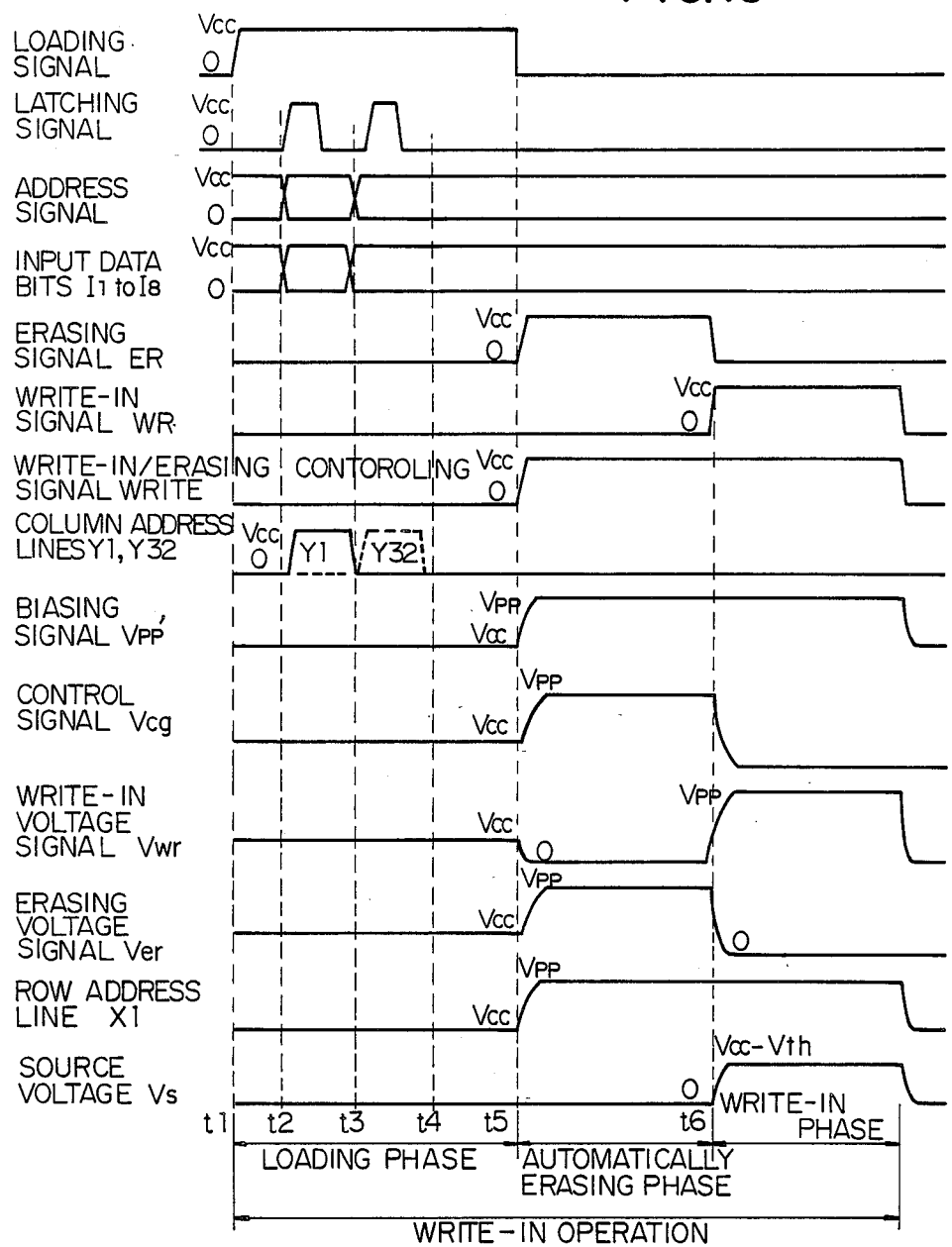
FIG. 13 is a diagram showing the waveforms of essential signals appearing in a write-in operation performed by the nonvolatile semiconductor memory device shown in FIG. 9.

FIG. 13 shows the waveforms of essential signals appearing in the write-in operation. The write-in operation starts with the loading phase, and the loading signal LOAD goes up from the ground level to the positive voltage level Vcc at time t1. However, the biasing signal vpp', the control signal Vcg and write-in voltage signal Vwr, the erasing voltage signal Ver and the row address line X1 remain in the positive voltage level Vcc, and the latching signal DL, the erasing signal ER, the write-in/erasing controlling signal WRITE and the source voltage Vs are in the ground level.

At time t2, column address line Y1 goes up to the positive voltage level Vcc, so that the byte column selecting transistor $Qg_1$ and the column address selecting transistors $Qy_{11}$ to $Qy_{18}$ turn on to provide respective conduction paths. The input data bits (10101010) are supplied to the data input circuit 68, and the latching circuits LT1 to LT8 are responsive to the latching circuit DL to store the input data bits, respectively. Then, the write-in controlling signal din1 to din8 are produced on the basis of the input data bits I1 to I8 and, then, supplied to the data input transistors Qin1 to Qin8, respectively. The write-in controlling signals din1, din3, din5 and din7 are shifted to the positive voltage level Vcc, but the write-in controlling signal din2, din4, din6 and din8 remain in the ground level. With the loading signal LOAD of the positive voltage level Vcc, the data input transistors are turned on to transfer the write-in controlling signals din1 to din8 through the column address selecting transistors $Qy_{11}$ to $Qy_{18}$ in the on-states to the source nodes SD11 to SD18. The source nodes SD11 to SD18 correspond in voltage level to the column latching circuits CL11 to CL18, respectively. The loading signal LOAD has been in the positive voltage level Vcc, so that the voltage levels at the source nodes SD11 to SD18 are latched into the column latching circuits CL11 to CL18, respectively. Since the biasing signal Vpp' and the write-in voltage signal Vwr remain in the positive voltage level Vcc, the source nodes SD11 to SD18 are clamped to the voltage level of "Vcc-Vth" or entered into the floating states depending upon the voltage level latched into the column latching circuits CL11 to C118.

The control signal Vcg remains in the positive voltage level Vcc and the column address line Y1 is also in the positive voltage level Vcc, so that the node SF1 goes up to the positive voltage level Vcc which is latched into the byte latching circuit BL1. The erasing voltage signal Ver remains in the positive voltage level Vcc, so that the node SF1 is clamped into the voltage level of "Vcc-Vth".

Subsequently, the column address line Y32 is shifted to the positive voltage level Vcc at time t3, so that the byte column selecting transistor $Qg_{32}$ and the column address selecting transistors $Qy_{321}$ to $Qy_{328}$ concurrently turn on to provide respective conduction paths. When the input data bits (01010101) are supplied to the data input circuit 68, the input data bits are latched into the latching circuits LT1 to LT8, and, accordingly, the write-in controlling signals din1 to din8 are supplied to the data input transistors Qin1 to Qin8 which are memorized in the column latching circuits CL321 to C1328 in a similar manner to the previous input data bits. The node SF32 is also clamped into the voltage level of "Vcc-Vth", but no further description is incorporated for avoidance of repeat.

The positive voltage level Vcc is applied to the row address line X1, so that the row address selecting transistor $Mb_{11}$ and the memory cell selecting transistors $Ms_{111}$ to $Ms_{1328}$ turn on to provide respective conduction paths. Then, the nodes SD11 to SD328, the nodes SF1 and SF32 are electrically connected to the respective drain nodes and the respective gate electrodes of the memory cell transistors $Mm_{111}$ to $Mm_{118}$ and $Mm_{1321}$ to $Mm_{1328}$. The source voltage Vs remains in the ground level during the loading phase, so that no write-in operation and no erasing operation is carried out for the memory cell transistors.

Automatically erasing phase

When the loading phase is finished, the non-volatile semiconductor memory device enters into the automatically erasing phase at time t5. The latching signal DL is recovered to the ground level, so that any input data bit is never latched into the latching circuit of the data input circuit 68. The biasing signal Vpp' goes up to a write-in/erasing level Vpp, but the write-in voltage signal Vwr is recovered to the ground level. Moreover, the erasing voltage signal Ver is shifted from the positive voltage level Vcc to the write-in/erasing voltage level Vpp, and the selected row address line X1 also rises to the write-in/erasing level Vpp, but the source voltage Vs remains in the ground level. In this situation, the biasing signal Vpp' and the erasing voltage signal Ver allows each of the nodes SF1 and SF32 to rise to a voltage level of "Vpp-Vth" due to a bootstrapping phenomenon which takes place in each byte latching circuit.

On the other hand, the source nodes such as SD11 is coupled to the memory cell transistors for which the data bits of "1" are provided and clamped to the positive voltage level Vcc in the loading phase. However, when the biasing signal Vpp' is shifted from the positive voltage level Vcc to the write-in/erasing level Vpp and the write-in voltage signal Vwr is recovered to the ground level, the source nodes such as SD11 go down to the ground level, because the node C1 of the write-in/erasing level Vpp allows to propagate the ground level to these source nodes. As to the source nodes coupled to the memory cell transistors for which the data bits of "0" are provided, the source nodes are shifted from the floating state to the ground level, because the column latching circuits isolate the source nodes from the write-in voltage signal Vwr but the memory cell transistors provide respective conduction paths to propagate the source voltage of the ground level. Thus, all of the memory cell transistors of the first and thirty second bytes have the source and drain nodes supplied with the ground level and the gate electrodes supplied with the voltage level of "Vpp-Vth", respectively, so that electrons are injected from the respective drain nodes into respective floating gates, thereby erasing the data bits memorized therein.

Write-in phase

The automatically erasing phase is completed at time t6, and, then, the non-volatile semiconductor memory device enters the write-in phase. In the write-in phase, the write-in signal WR is shifted from the ground level to the positive voltage level Vcc, but the control signal Vcg and the erasing voltage signal Ver is shifted from the write-in/erasing level Vpp to the ground level. Moreover, the write-in voltage signal Vwr goes up from the ground level to the write-in/erasing level Vpp, and the source voltage Vs rises from the ground level to the voltage level of "Vcc-Vth". In this situation, the byte latching circuits BL1 and B132 keep the write-in/erasing level Vpp to provide the conduction path to the nodes SF1 and SF32, so that the nodes SF1 and SF32 are discharged through the byte latching circuits BL1 and BL32, thereby going down to the ground. As to the column latching circuits associated with the memory cell transistors for which the data bits of "1" are provided, the write-in/erasing level Vpp is kept therein to provided the conduction paths to the source nodes SD11, then write-in voltage signal of the write-in/erasing level Vpp is transferred to the source nodes such as SD11. This results in that the source nodes rise to the voltage level of "Vpp-Vth". On the other hand, the column latching circuits associated with the memory cell transistors for which no write-in operation is carried out isolate the source nodes from the write-in voltage Vwr of the write-in/erasing level, thereby allowing the source nodes to stay in the floating states, respectively. As a result, each memory cell transistor for which the data bit of "1" is provided has the drain node supplied with the voltage level of "Vpp-Vth", the gate electrode supplied with the ground level and the source node supplied with the voltage level of "Vcc-Vth", and the electrons are discharged from the floating gate to the drain node thereof. Then, the input data bit of "1" is written into each memory cell transistor. On the other hand, each memory cell transistor for which the input data bit of "0" is provided has the drain node in the floating state, the gate electrode supplied with the ground level and the source node supplied with the voltage level of "Vcc-Vth", then the memory cell transistor keeps the electrons in the floating gate thereof. This results in that each memory cell transistor memorizing the input data bit of "1" is different in threshold level from each memory cell transistor memorizing the input data bit of "0".

The non-volatile memory device described above concurrently writes two bytes of input data bits into the two memory cell groups during a single write-in operation. However, the nonvolatile semiconductor memory device illustrated in FIG. 9 are available for a simultaneous write-in operation carried out for 32 bytes of input data bits.

As described above, the non-volatile semiconductor memory device according to the present invention is advantageous over the prior-art non-volatile semiconductor memory device in simplicity in circuit arrangement by virtue of the column and byte latching circuits. Namely, the data input circuit is formed without the gate transistors, because the write-in voltage signal Vwr is controlled by the column address selecting transistors $Qy_{11}$ to $Qy_{328}$. Moreover, the byte column selecting circuit 25 and, accordingly, the byte column selecting lines are not incorporated in the non-volatile semiconductor memory device according to the present invention, because the byte latching circuits are provided for controlling the voltage levels at the gate electrodes of the memory cell transistors. Then, the nonvolatile semiconductor memory device according to the present invention occupies a relatively small area, thereby decreasing the chip size.

Second embodiment

Figure 14:
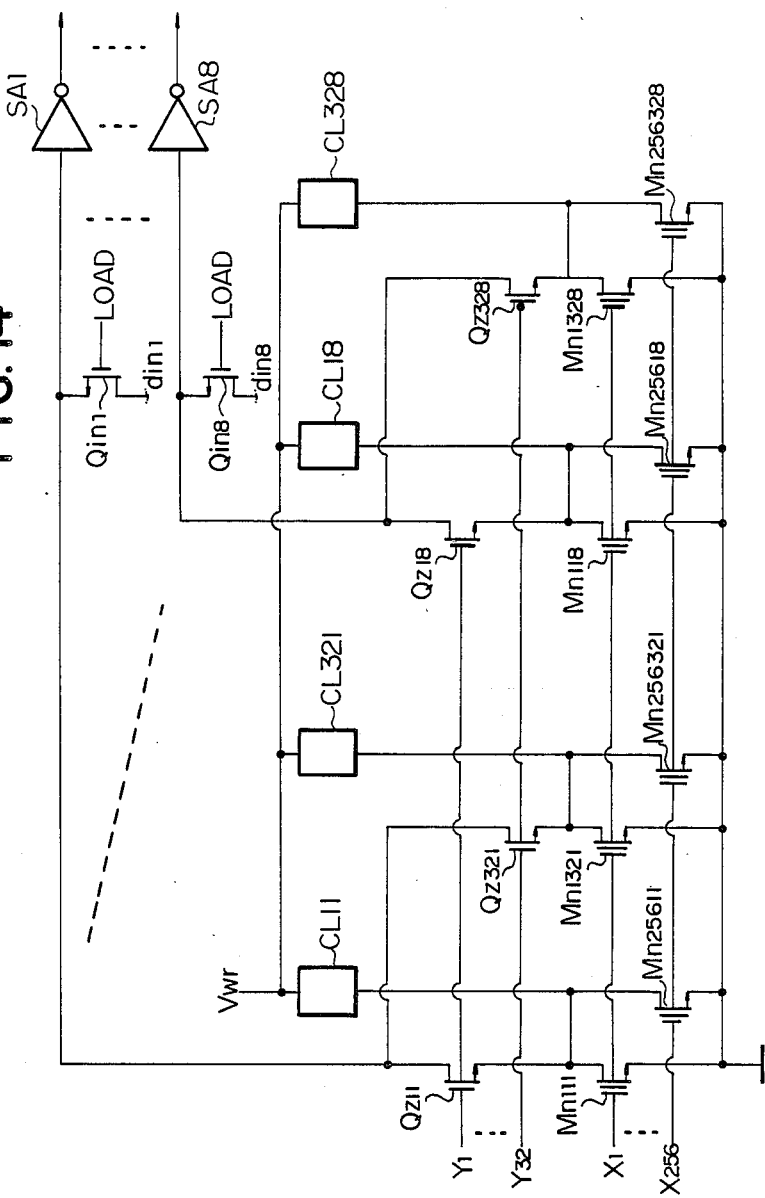
FIG. 14 is a diagram showing the circuit arrangement of another non-volatile semiconductor memory device embodying the present invention.

Turning to FIG. 14 of the drawings, there is shown the circuit arrangement of another non-volatile semiconductor memory device according to the present invention. The non-volatile semiconductor memory device illustrated in FIG. 14 is of the erasable programmable read only memory, so that a memory cell array 81 is relatively simple with respect to the electrically erasable programmable read only memory device. The memory cell array 81 is associated with 256 row address lines X1 to X256 and 32 column address lines Y1 to Y32. Each of the column address lines Y1 to Y32 is coupled to each of column address selecting transistors $Qz_{11}$ to $Q_{Z18}$, and each of the row address lines X1 to X256 is coupled to each row of memory cell transistors $Mn_{111}$ to $Mn_{256328}$. With a single activated row address line and a single activated column address line, eight memory cell transistors are accessible. Each of column latching circuits CL11 to CL328 is shared by the memory cell transistors different in bit location and row address location from one another, and each column latching circuit is similar in circuit arrangement to that of the non-volatile semiconductor memory device illustrated in FIG. 9. However, other component elements such as, for example, data input transistors are denoted by like reference numerals used for designating the corresponding components elements. Though not shown in the drawings, the write-in controlling signals din1 to din8 are produced by a data input circuit similar in circuit arrangement to that illustrated in FIG. 10.

Figure 15:
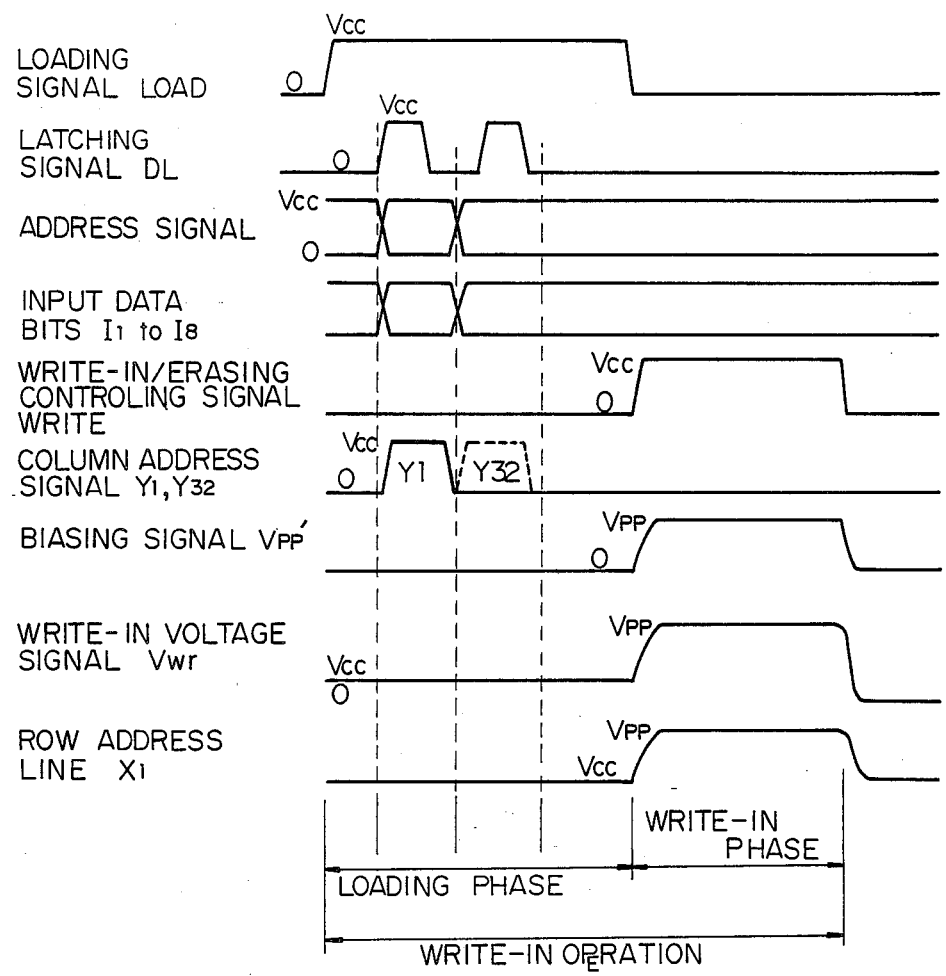
FIG. 15 is a diagram showing the waveforms of essential signals arreaing in the non-volatile semiconductor memory device illustrated in FIG. 14.

The data bit memorized in each memory cell transistor is erased by, for example, a radiation of ultra-violet lights, so that no automatically erasing phase is incorporated in a write-in operation. In other words, each write-in operation is constituted by a loading phase followed by a write-in phase. The write-in operation is described hereinbefore with reference to FIG. 15 which shows the waveforms of essential signals.

Loading phase

When a byte of input data bits are supplied to the nonvolatile semiconductor memory device, the input data bits are latched into the data input circuit for producing the write-in controlling signals din1 to din8. Since the loading signal LOAD is in the positive voltage level Vcc, all of the data input transistors Qin1 to Qin8 turn on to provide respective conduction paths. Then, the write-in controlling signals din1 to din8 are stored in the column latching circuits CL11 to CL18, respectively. Similarly, input data bits are latched into the column latching circuits CL321 to CL328. Then, each column latching circuit storing the input data bit of "1" causes the drain node of the memory cell transistor to have the voltage level of "Vcc-Vth", but the column latching circuits storing the input data bits of "0" allow the drain nodes of the memory cell transistors to remain in the ground level.

Write-in phase

The biasing signal Vpp', the write-in voltage signal Vwr and the selected row address signal X1 are shifted from the positive voltage level Vcc to the write-in voltage level Vpp, and each of the column latching circuits coupled to the memory cell transistor supplied with the input data bit of "1" allows the drain node of the memory cell transistor to go up to the voltage level of "Vpp-Vth", and the write-in level Vpp is supplied to the gate electrode of the memory cell transistor, so that electrons are injected into the floating gate thereof. Then, the input data bits of "1" are memorized into the memory cell transistors.

On the other hand, the other column latching circuits cause the drain nodes of the memory cell transistors supplied with the input data bits of "0" to isolate from the write-in level Vpp, so that no electron injection takes place. Thus, the memory cell transistors memorizing the input data bits of "1" are different in threshold level from the memory cell transistors memorizing the input data bits of "0" due to the injection of electrons.

Although particular embodiments of the present invention have been shown and described, it will be obvious to those skilled in the art that various changes and modifications may be made without departing from the spirit and scope of the present invention.

What is claimed is:

1. A non-volatile semiconductor memory device fabricated on a semiconductor substrate, said non-volatile semiconductor memory device being capable of performing a write-in operation having a loading phase, an automatically erasing phase and a write-in phase, comprising:

(a) a plurality of memory cell groups arranged in rows and columns, each memory cell group being provided with a plurality of memory cell transistors assigned respective bit locations and having respective gate electrodes;

(b) a plurality of memory cell selecting transistors each coupled in series to each of said memory cell transistors and having a gate electrode;

(c) a plurality of row address selecting transistors each coupled to the gate electrodes of said memory cell transistors in each memory cell group and having a gate electrode;

(d) a plurality of byte column selecting transistors each provided in association with said memory cell groups in each column and capable of providing a conduction path between a source of control signal and said row address selecting transistors respectively provided in association with said memory cell groups in each column, each of said byte column selecting transistor having a gate electrode, said control signal being shifted to a third level in said automatically erasing phase but remaining in a second level in said loading phase and said write-in phase;

(e) a plurality of column address selecting transistor groups each provided in association with said memory cell groups in each column and having a plurality of column address selecting transistors respectively coupled to said memory cell selecting transistors having the respective bit locations identical with one another;

(f) a plurality of column latching circuit group each provided in association with said memory cell groups in each column and having a plurality of latching circuits coupled to said memory cell selecting transistors having the respective bit locations identical with one another, said column latching circuits being coupled to a source of write-in voltage signal;

(g) a plurality of byte latching circuits each provided in association with each of said byte column selecting transistors and coupled between said row address selecting transistors respectively provided in association with said memory cell groups in each column and a source of erasing voltage signal;

(h) a source voltage controlling circuit responsive to a write-in signal and producing a source voltage supplied to source nodes of said memory cell transistors, said source voltage being shifted to a level near said second level in said write-in phase but remaining in a first level in said loading phase and said automatically erasing phase;

(i) a data input circuit operative to latch a plurality of input data bits each having said first or second level and producing a plurality of write-in controlling signals each having the first or second level on the basis of said input data bits;

(j) a plurality of data input transistors each coupled to said column address selecting transistors provided in association with memory cell selecting transistors respectively having the bit locations identical with one another, each of said data input transistors being responsive to a loading signal shifted to an active level in said loading phase to transfer each of write-in controlling signal to said column address selecting transistors, said loading signal being shifted to an inactive level in said automatically erasing phase and said write-in phase;

(k) a plurality of row address lines each coupled to the gate electrodes of said memory cell selecting transistors and said row address selecting transistors which are respectively provided in association with said memory cell groups in each row, said row address lines propagating row address signals one of which is shifted to an active level in said automatically erasing phase and said write-in phase to allow said memory cell selecting transistors and said row address selecting transistors to turn on, said row address signals being shifted to an inactive level in said loading phase; and (l) a plurality of column address lines each coupled to the gate electrodes of said byte column selecting transistor and said column address selecting transistors provided in association with said memory cell groups in each column, said column address lines propagating column address signals, two or more that two of said column address signals being shifted in succession to said second level in said loading phase for allowing said control signal to be latched into said byte latching circuits and for allowing said column latching circuits to latch said write-in controlling signals, respectively, said column address signals remaining in said first level in said automatically erasing phase and said write-in phase, in which said write-in voltage signal and said erasing voltage signal are respectively shifted to the first level and third level in said automatically erasing phase and to the third level and the first level in said write-in phase, said control signal of said second level in each byte latching circuit of said second level being shifted to said third level in the presence of said erasing voltage signal of third level for automatically erasing functions, each write-in controlling signal of said second level being shifted to said third level in the presence of said write-in voltage signal of said third level for write-in function.

2. A non-volatile semiconductor memory device as set forth in claim 1, in which each of said column latching circuits comprises a first gate transistor gated by said loading signal, a combined circuit for latching and bootstrapping functions coupled to said first gate transistor and a drive transistor having a gate electrode coupled to the combined circuit, said write-in voltage being supplied to said drive transistor.

3. A non-volatile semiconductor memory device as set forth in claim 2, in which said combined circuit comprises a first series combination of a p-channel transistor and an n-channel transistor coupled between a source of biasing signal and a source of said first level and a second series combination of a p-channel transistor and an n-channel transistor coupled between said source of biasing signal and said source of said first level and in which each of said p-channel transistors are formed in an n-well coupled to said source of biasing signal, wherein said biasing signal is shifted from said second level to said third level in said automatically erasing and write-in phases.

4. A non-volatile semiconductor memory device as set forth in claim 1, in which each of said byte latching circuits comprises a third gate transistor gated by said loading signal, a combined circuit for latching and bootstrapping functions coupled to said third gate transistor and a drive transistor having a gate electrode coupled to the combined circuit, said erasing voltage signal being supplied to said drive transistor.

5. A non-volatile semiconductor memory device as set forth in claim 4, in which said combined circuit comprises a third series combination of a p-channel transistor and an n-channel transistor coupled between a source of biasing signal and a source of said first level and a fourth series combination of a p-channel transistor and an n-channel transistor coupled between said source of biasing signal and said source of said first level and in which each of said p-channel transistors are formed in an n-well coupled to said source of biasing signal, wherein said biasing signal is shifted from said second level to said third level in said automatically erasing and write-in phases.

6. A non-volatile semiconductor memory device as set forth in claim 1, in which said data input circuit comprises a plurality of latching circuits.

7. A non-volatile semiconductor memory device as set forth in claim 1, in which each of said memory cell transistors is of an electrically erasable programmable read only memory.

8. A non-volatile semiconductor memory device fabricated on a semiconductor substrate, said non-volatile semiconductor memory device being capable of performing a write-in operation having a loading phase and a write-in phase, comprising:

(a) a plurality of memory cell groups arranged in rows and columns, each memory cell group being provided with a plurality of memory cell transistors assigned respective bit locations and having respective gate electrodes, said memory cell transistors having source nodes coupled to a source of first level;

(b) a plurality of column address selecting transistors each provided in association with said memory cell groups in each column and respectively coupled to said memory cell transistors having the respective bit locations identical with one another;

(c) a plurality of column latching circuit group each provided in association with said memory cell groups in each column and having a plurality of latching circuits coupled to said memory cell transistors having the respective bit locations identical with one another, said column latching circuits being coupled to a source of write-in voltage signal;

(d) a data input circuit operative to latch a plurality of input data bits each having said first level or a second level and producing a plurality of write-in controlling signals each having the first or second level on the basis of said input data bits;

(e) a plurality of data input transistors each coupled to said column address selecting transistors provided in association with memory cell transistors respectively having the bit locations identical with one another, each of said data input transistors being responsive to a loading signal shifted to an active level in said loading phase to transfer each of write-in controlling signal to said column address selecting transistors, said loading signal being shifted to an inactive level in said write-in phase;

(f) a plurality of row address lines each coupled to the gate electrodes of said memory cell transistors which are respectively provided in association with said memory cell groups in each row, said row address lines propagating row address signals one of which is shifted to a third level, said row address signals being shifted to said second level in said loading phase; and (g) a plurality of column address lines each coupled to the gate electrodes of said column address selecting transistors provided in association with each memory cell group for gating said column address selecting transistors, said column address lines propagating column address signals, two or more that two of said column address signals being shifted in succession to said second level in said loading phase for allowing said column latching circuits to latch said write-in controlling signals, respectively, said column address signals remaining in said first level in said write-in phase, in which said write-in voltage signal are shifted from the first level to the third level in said write-in phase, each write-in controlling signal of said second level being shifted to said third level in the presence of said write-in voltage signal of said third level for write-in function.

9. A non-volatile semiconductor memory device as set forth in claim 8, in which each of said column latching circuits comprises a first gate transistor gated by said loading signal, a combined circuit for latching and bootstrapping functions coupled to said first gate transistor and a drive transistor having a gate electrode coupled to the combined circuit, said write-in voltage being supplied to said drive transistor.

10. A non-volatile semiconductor memory device as set forth in claim 9, in which said combined circuit comprises a first series combination of a p-channel transistor and an n-channel transistor coupled between a source of biasing signal and a source of said first level and a second series combination of a p-channel transistor and an n-channel transistor coupled between said source of biasing signal and said source of said first level and in which each of said p-channel transistors are formed in an n-well coupled to said source of biasing signal, wherein said biasing signal is shifted from said second level to said third level in said automatically erasing and write-in phases.

11. A non-volatile semiconductor memory device as set forth in claim 10, in which each of said memory cell transistors is of an erasable programmable read only memory.

* * * * *

UNITED STATES PATENT AND TRADEMARK OFFICE
CERTIFICATE OF CORRECTION

PATENT NO. : 4,887,242
DATED : December 12, 1989
INVENTOR(S) : Kiyokazu Hashimoto It is certified that error appears in the above-identified patent and that said Letters Patent is hereby corrected as shown below:

On the title page:

[30] Foreign Application Priority Data, delete "Oct. 9, 1988", and insert --Oct. 9, 1987--.

Column 10, line 48, delete "identical withone", and insert --identical with one--.

Column 12, line 67, delete "arreaing", and insert --appearing--.

Signed and Sealed this

Twelfth Day of March, 1991

*Attest:*

HARRY F. MANBECK, JR.

*Attesting Officer*     *Commissioner of Patents and Trademarks*